United States Patent [19]

Dawkins

[11] Patent Number: 4,916,577
[45] Date of Patent: Apr. 10, 1990

[54] METHOD OF MOUNTING REMOVABLE MODULES

[75] Inventor: Bertram H. Dawkins, Northport, N.Y.

[73] Assignee: Grumman Aerospace Corporation, Bethpage, N.Y.

[21] Appl. No.: 286,833

[22] Filed: Dec. 20, 1988

[51] Int. Cl.$^4$ ............................................. H05K 7/12
[52] U.S. Cl. ................................................... 361/417
[58] Field of Search ............... 343/850, 848, 829, 846; 361/417, 419, 420

[56] References Cited

U.S. PATENT DOCUMENTS

| | | |
|---|---|---|
| 911,846 | 2/1909 | Shuart . |
| 1,878,247 | 9/1932 | Beck . |
| 2,010,519 | 8/1935 | Jones . |
| 2,047,298 | 7/1936 | Tinnerman . |
| 2,117,775 | 5/1938 | Tinnerman . |
| 2,135,417 | 11/1938 | Tinnerman . |
| 2,236,929 | 4/1941 | Tinnerman . |
| 2,288,710 | 7/1942 | Hotchkin . |
| 2,775,917 | 1/1957 | Ferguson . |
| 3,258,649 | 6/1966 | Arguin et al. ....................... 361/417 |
| 3,264,534 | 8/1966 | Murphy . |
| 3,326,509 | 6/1967 | Kuttler . |
| 3,332,712 | 7/1967 | Holton . |

Primary Examiner—Roy N. Envall, Jr.
Attorney, Agent, or Firm—Pollock, Van deSande & Priddy

[57] ABSTRACT

Electronic modules may be retained within a thin flexible support member by forming a peripheral groove within the module. A cutout is formed within the support member so that resulting edge flanges snap into the groove. A thin continuous spring retainer, having a sinusoidal length, is pushed over the module and likewise snaps into the groove so that the flanges of the support member become rigidified and secure the module thereto.

9 Claims, 1 Drawing Sheet

METHOD OF MOUNTING REMOVABLE MODULES

FIELD OF THE INVENTION

The present invention relates generally to a retaining device and certain interface features which permit the rapid and secure attachment of electronic modular components to a flexible support member.

BACKGROUND OF THE INVENTION

In a wide variety of assemblies, it is necessary to mount rigid modular components onto a flexible support member. In one exemplary application, a large number of electronic modules are to be mounted to the flexible ground plane sheet of a roll-up antenna.

Prior art in current practice would employ the use of discrete fasteners, such a screws or rivets, or methods of welding, soldering or adhesive bonding to secure the modules in place. The use of discrete fasteners, however, would require that holes or threaded inserts be incorporated within the module case, limiting the space within the module available for the electronic circuitry. In addition, discrete fateners do not fasten well to thin flexible sheets and would result in tearing and damage to the support member material. The utilization of discrete fasteners always poses the possibility of sharp edges or protuberances that would damage or snag the adjoining layers of a rolled-up antenna. Further, when a large number of modules are to be mounted, the installation of individual, small fasteners becomes a tedious, time-consuming procedure. The use of welding, soldering or adhesive bonding methods would subject both the module and the surrounding support member to high temperatures and/or pressures and expose these components to the risk of damage. The permanent nature of these attachment methods would make it difficult to replace a faulty module without damaging the surrounding material.

The present invention offers a novel method that permits the modules to be quickly and easily installed, provides a secure structural attachment to a flexible support member, can be easily removed without damage, has a minimum impact on the layout of the module's internal circuitry, and presents a smooth, non-snagging outline.

BRIEF DESCRIPTION OF THE INVENTION

The present invention provides a means of installing modular components into a flexible support member. The principal features of the invention are: a mounting flange with a special opening which is part of, or attached to, the support member, a peripheral groove in the module, and one or more retainer devices. When installed the module is held within the mounting flange opening and secured in place with one or more spring-like retainers. The retainers capture the flexible mounting flange material within the module groove, rigidifying the flange material, and securing the module in place. The elasticity of the retainers permits them to be installed and removed without damage, permitting the convenient replacement of a faulty module.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
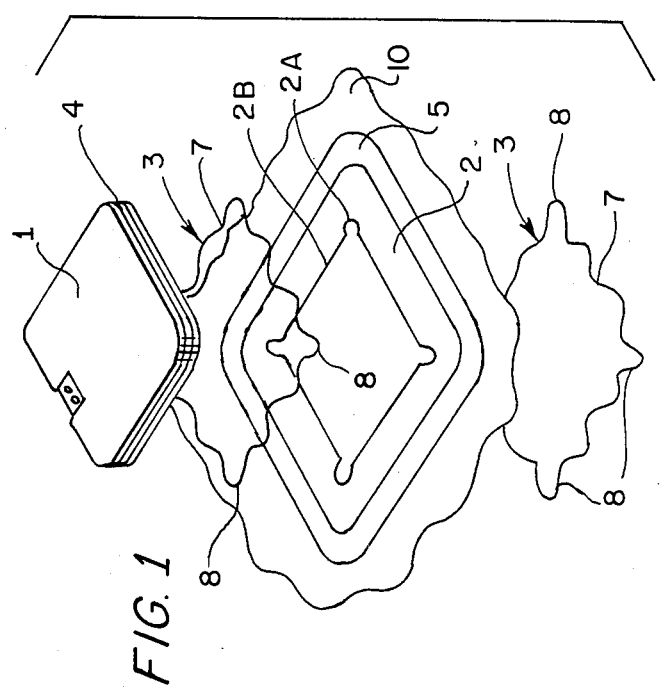
FIG. 1 is an exploded view of a first embodiment of the present invention utilizing a double retainer configuration.

Referring to the figures and more particularly FIG. 1, an exploded view of a first embodiment of the present invention is illustrated. An electronic module 1 may include circuitry and components of conventional and available design. The object of the present invention is to securely mount the module 1 to a support member 10 which, in a preferred utilization of the invention, might be a flexible antenna ground plane. The support member which in the first embodiment is a flexible member may also be a solid, non-flexible member as well.

In order to achieve this, a continuous peripheral groove 4 is formed along the circumferential edge of module 1. This groove is adapted to receive the rectilinear edges of a cutout formed in a flexible sheet which serves as a mounting flange 2. The cutout in flange 2 is of similar shape as the module 1, and in the example shown in FIG. 1, is of a generally square shape. The mounting flange 2, which in the first embodiment is secured to the support member 10 by means of a non-flexible rim 5 using conventional means such as an appropriate adhesive, may also be integral with the support member material 10. The module is installed onto the support member 10 and more particularly the mounting flange 2 by urging the module 1 against the flange 2. The flange includes corner slots 2A which create four side flaps 2B. As the module 1 is urged against the flexible mounting flange 2, the flaps deflect until they snap into the peripheral groove 4.

In order to retain the module 1 in place, continuous, resilient retainers generally indicated by reference numeral 3, having the same general shape as the module 1 outline are fitted over the module 1 until they also snap into the groove 4. In FIG. 1, two such retainers 3 are illustrated. Each retainer 3 of this double configuration is installed on an opposite side of the mounting flange 2. The purpose of each retainer 3 is to stiffen the local flexibility of the mounting flange flaps 2B, thereby securing the module in place. As is clearly illustrated in FIG. 1, the retainer 3 includes an undulating sinusoidal-like shape along its four sides 7 while four protruding corners 8 complete the continuity of each retainer. It is the sinusoidal nature of the retainer length, coupled with an appropriate spring material, which gives the retainer 3 the needed resilience to be pushed over module 1 and snap into the module groove 4 as well as accommodating flexing motion of the support member without forcing the module to pop out.

Figure 2:
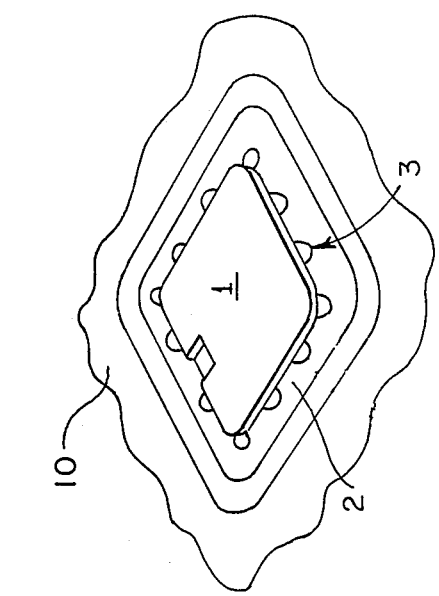
FIG. 2 is a perspective view of an installed module in accordance with the present invention.

FIG. 2 is a perspective view of a module as installed within the support member 10. As will be seen, the sinusoidal nature of the retainer sides 7 effects retention of points along the retainer within groove 4 while also permitting other points of the retainer to extend outwardly and abut against the flange flaps 2B to achieve the necessary module retention.

Figure 3:
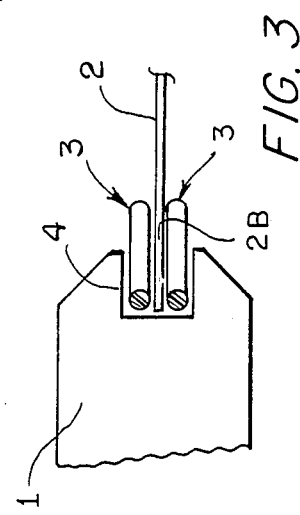
FIG. 3 is a partial sectional view illustrating the engagement between a module and a double retainer configuration.

FIG. 3 illustrates the cross-sectional relationship between retainers 3, flange flaps 2B and module groove 4. It will be noticed that the combined thickness of the retainers 3 and the thickness of the flaps 2B roughly equal the width of groove 4. By achieving "tightness" between these components, the rigidifying effect of the retainers becomes increased.

Figure 4:
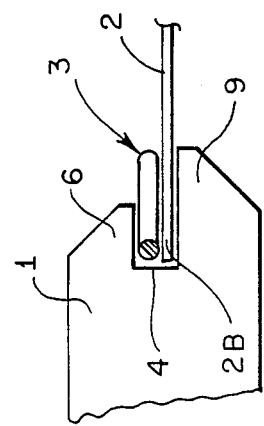
FIG. 4 is a partial sectional view illustrating the engagement between a module and a single retainer configuration.

Although FIGS. 1 and 3 specifically show a double retainer configuration, a single retainer may be employed. This is shown in FIG. 4. In the case of a single retainer configuration, it is preferable to have one lip 9 of the groove 4 extend beyond the lip 6 of the groove so as to offer an additional support platform for rigidifying the flange flaps 2B.

Thus, the present invention offers a means of securing modular components by providing structural integrity to a thin, flexible support member. Such a support member may be a ground plane of an antenna, and by employing the present invention, it is possible to prevent RF leakage past the module-support member joint. It is also to be mentioned that, with the present invention, modules may be conveniently and easily removed by reversing the installation procedure discussed. This permits rapid replacement of faulty modules.

It should be understood that the invention is not limited to the exact details of construction shown and described herein for obvious modifications will occur to persons skilled in the art.

I claim:

1. A system for mounting a module to a support member comprising:
   a groove formed along the periphery of the module;
   a flexible flange forming a boundary of a cutout in the support member for engaging the groove when the module is pushed into the cutout; and
   continuous spring retainer means having undulating sides which expand when pushed over the module for allowing snap insertion of the retainer into the groove for overlying abutment with the flange;
   thereby rigidifying the flange and securing the module to the support member.

2. The structure set forth in claim 1 wherein the support member is an antenna ground plane.

3. The structure set forth in claim 1 wherein the retainer means comprises a single spring retainer for overlying abutment of a first surface of the flange.

4. The structure set forth in claim 1 wherein the retainer means comprises first and second spring retainers for abutment of opposite surfaces of the flange.

5. A system for mounting a module to a support member comprising:
   a continuous groove formed along the periphery of the module;
   a cutout formed in the support member and having rectilinear edges;
   flexible flange sections extending inwardly from the edges;
   slots formed in the corners of the flange sections to allow independent movement of the flange sections sufficient for engaging the groove when the module is pushed into the cutout; and
   continuous spring retainer means having the substantially same shape as the cutout including undulating sides and curved corners for facilitating expansion of the retainer means when it is pushed over the module;
   thereby rigidifying the flange for securing the module to the support member.

6. The structure set forth in claim 5 wherein the support member is an antenna ground plane.

7. A method for mounting electronic modules to a flexible support member of an antenna comprising the steps:
   forming a continuous groove along the periphery of the module;
   forming a cutout in the support member having rectilinear sides;
   forming flexible flange sections along each cutout side which extend inwardly of the cutout, the flange sections being separated by slots formed in the corners of the flange sections;
   pushing a retainer means having substantially the same shape as the groove over the module whereby undulating sides of the retainer means expand until it snaps into the groove for overlying abutment with the flange;
   thereby rigidifying the flange for securement of the module to the support member.

8. The method set forth in claim 7 wherein the retainer means comprises a single spring retainer for overlying abutment of a first surface of the flange sections.

9. The method set forth in claim 7 wherein the retainer means comprises first and second spring retainers for abutment of opposite surfaces of the flange sections.

* * * * *

UNITED STATES PATENT AND TRADEMARK OFFICE
CERTIFICATE OF CORRECTION

PATENT NO. : 4,916,577
DATED : April 10, 1990
INVENTOR(S) : Bertram H. Dawkins

It is certified that error appears in the above-identified patent and that said Letters Patent is hereby corrected as shown below:

Column 1, line 25, change "fateners" to --fasteners--.

Signed and Sealed this

Ninth Day of July, 1991

*Attest:*

HARRY F. MANBECK, JR.

*Attesting Officer*    *Commissioner of Patents and Trademarks*

UNITED STATES PATENT AND TRADEMARK OFFICE
CERTIFICATE OF CORRECTION

PATENT NO.    : 4,916,577
DATED         : April 10, 1990
INVENTOR(S)   : Bertram H. Dawkins It is certified that error appears in the above-identified patent and that said Letters Patent is hereby corrected as shown below:

Column 1, line 25, change "fateners" to --fasteners--.

Signed and Sealed this

Twenty-seventh Day of August, 1991

Attest:

HARRY F. MANBECK, JR.

*Attesting Officer*    *Commissioner of Patents and Trademarks*